(12) United States Patent
Schulz et al.

(10) Patent No.: US 6,867,948 B1
(45) Date of Patent: Mar. 15, 2005

(54) DISC DRIVES HAVING FLEXIBLE CIRCUITS WITH LIQUID CRYSTAL POLYMER DIELECTRIC

(75) Inventors: Kevin Jon Schulz, Apple Valley, MN (US); Adam Karl Himes, Richfield, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 599 days.

(21) Appl. No.: 09/457,816

(22) Filed: Dec. 9, 1999

Related U.S. Application Data

(60) Provisional application No. 60/116,781, filed on Jan. 22, 1999.

(51) Int. Cl.[7] ............................................... G11B 5/48
(52) U.S. Cl. .................................................. 360/245.9
(58) Field of Search ......................... 360/245.9, 245.8, 360/264.2, 266.3

(56) References Cited

U.S. PATENT DOCUMENTS

| | | | |
|---|---|---|---|
| 4,670,804 A | | 6/1987 | Kant et al. .................... 360/102 |
| 4,839,232 A | | 6/1989 | Morita et al. ............. 428/473.5 |
| 4,937,133 A | | 6/1990 | Watanabe et al. ............ 428/209 |
| 4,991,045 A | | 2/1991 | Oberg ......................... 360/104 |
| 4,996,623 A | | 2/1991 | Erpelding et al. ........... 360/104 |
| 5,006,946 A | | 4/1991 | Matsuzaki ................... 360/104 |
| 5,111,363 A | * | 5/1992 | Yagi et al. ................... 361/751 |
| 5,185,683 A | * | 2/1993 | Oberg et al. ................ 360/104 |
| 5,246,782 A | * | 9/1993 | Kennedy et al. ............ 428/421 |
| 5,266,658 A | * | 11/1993 | Dashevsky et al. .......... 525/444 |
| 5,352,318 A | * | 10/1994 | Takabayashi et al. ..... 156/272.6 |
| 5,606,477 A | | 2/1997 | Erpelding et al. ........... 360/104 |
| 5,645,735 A | | 7/1997 | Bennin et al. ................. 216/22 |
| 5,688,146 A | * | 11/1997 | McGinley et al. ........... 439/637 |
| 5,730,922 A | * | 3/1998 | Babb et al. .................. 264/258 |
| 5,771,135 A | | 6/1998 | Ruiz et al. ................... 360/104 |
| 5,781,379 A | | 7/1998 | Erpelding et al. ........... 360/104 |
| 5,795,162 A | * | 8/1998 | Lambert ........................ 439/63 |
| 5,796,556 A | | 8/1998 | Boutaghou ................... 360/104 |
| 5,822,154 A | | 10/1998 | Takahashi et al. ........... 360/104 |
| 5,839,193 A | | 11/1998 | Bennin et al. .............. 29/896.9 |
| 5,843,562 A | * | 12/1998 | Onodera et al. ............. 428/141 |
| 5,844,751 A | | 12/1998 | Bennin et al. ............... 360/104 |
| 5,870,258 A | | 2/1999 | Khan et al. .................. 360/104 |
| 5,905,129 A | * | 5/1999 | Murakami et al. ........... 526/281 |
| 5,925,206 A | * | 7/1999 | Boyko et al. ................ 156/150 |
| 5,955,703 A | * | 9/1999 | Daly et al. ............... 174/117 R |
| 5,981,135 A | * | 11/1999 | Koes et al. .................. 430/165 |
| 6,046,886 A | * | 4/2000 | Himes et al. ................ 360/104 |
| 6,084,747 A | * | 7/2000 | Takahashi .................... 360/104 |
| 6,165,309 A | * | 12/2000 | Burnell et al. ............ 156/308.2 |
| 6,243,946 B1 | * | 6/2001 | Suzuki et al. .................. 29/846 |

* cited by examiner

*Primary Examiner*—Brian E. Miller
(74) *Attorney, Agent, or Firm*—Westman, Champlin & Kelly, P.A.

(57) ABSTRACT

A flexible circuit includes a dielectric liquid crystal polymer. The liquid crystal polymer supports electrically conductive elements. The liquid crystal provides improved properties to the flexible polymer. A suspension assembly can be formed with a transducer head supported on an adjustable arm, where the flexible circuit provides electrical connection to the transducer.

12 Claims, 5 Drawing Sheets

DISC DRIVES HAVING FLEXIBLE CIRCUITS WITH LIQUID CRYSTAL POLYMER DIELECTRIC

CROSS REFERENCE TO RELATED APPLICATIONS

This application claims priority to U.S. provisional Patent Application Ser. No. 60/116,781 filed Jan. 22, 1999 to Schulz et al., entitled "Flex on Suspension (FOS) With Liquid Crystal Polymer (LCP) Dielectric," incorporated herein by reference; and to U.S. patent application Ser. No. 09/076,164 to Himes et al., entitled "Flex Circuit Head Interconnect With Insulating Spacer," now U.S. Pat. No. 6,046,886, incorporated herein by reference.

BACKGROUND OF THE INVENTION

The invention relates to flexible circuits that are useful in suspension arm assemblies, for example, in disc drive units.

Flexible circuits can be useful for a variety of applications for connecting elements that can move relative to each other. For example, a transducer can be mounted on a moveable arm or the like such that the transducer can perform measurements at different location. The moveable arm generally includes a suspension assembly that provides for relative motion of the arm. In particular, disc drives for data storage include a head that carries transducers to facilitate reading and/or writing of data on the disc. Also, glide testers are disc drive units that are used to examine data storage discs for imperfections in the disc surface.

Disc drives are used for storing information, typically as magnetically encoded data, and more recently as optically encoded data, on a disc surface. The disc spin at high rotational velocities such that the head flies above the disc surface on a cushion of air. The suspension arm is used for radially accessing different data tracks on the rotating discs.

Generally, all hard drive discs are tested before shipment. During a glide test, the glide head or slider flies over a disc surface generally at a predetermined clearance from the disc surface, known as the glide height or fly height. If contact occurs between the glide head and a disc defect or asperity, forces on the glide head create responses that can be measured with transducers.

When any type of transducer head is flying above a spinning disc surface, heads experience undesirable radial forces, circumferential forces and yaw torques. The effects of these forces are preferably reduced or eliminated while necessarily allowing for roll and pitch movement of the transducer head. While the transducer head is experiencing these forces, an electrical connection must be maintained between the transducers and the signal processing components of the disc drive. A flexible circuit or flex cable provides the electrical connection between the head and the remaining portions of the disc drive unit.

The electrical connections preferably do not significantly effect the performance characteristics of the suspension assembly. As storage densities on disc recording media become higher, the performance characteristics of all of the disc drive components become more strict and tolerances are reduced. Therefore, as storage densities increase, it becomes even more important to reduce the effects on performance due to a flexible circuit.

SUMMARY OF THE INVENTION

In a first aspect, the invention pertains to a flexible circuit comprising an electrically conductive element and a dielectric liquid crystal substrate laminated to the conductive element. A suspension assembly can be formed using the flexible circuit. In particular, the suspension assembly includes a transducer head supported on an adjustable arm and a flexible circuit, wherein the flexible circuit is electrically connected to the transducer head. In addition, a disc drive with a data storage disc can be formed from the suspension assembly.

In a further aspect, the invention pertains to a method for producing a flexible circuit comprising joining a dielectric liquid crystal polymer substrate to an electrically conductive element.

DETAILED DESCRIPTION OF THE ILLUSTRATIVE EMBODIMENTS

Figure 1:
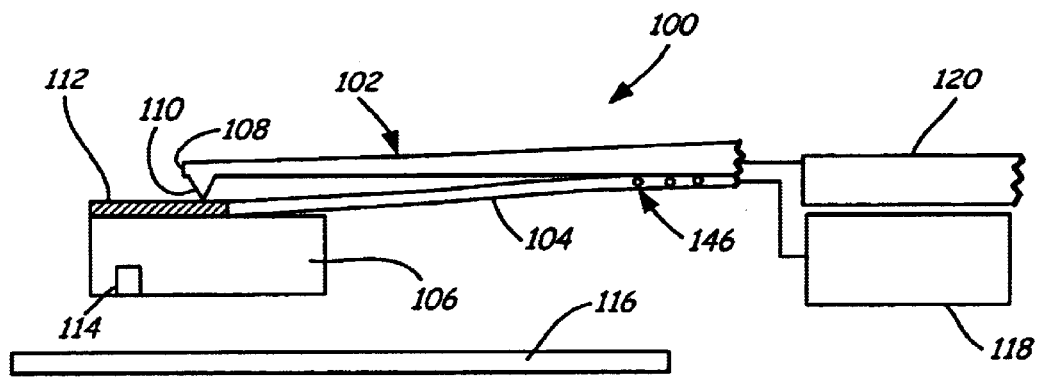
FIG. 1 is a schematic side view of a suspension assembly with a flexible circuit connecting a transducer head with external electronics.

Improved flexible circuits of the invention incorporate dielectric liquid crystal polymers as a flexible substrate for the flexible circuit. Liquid crystal polymers have reduced sensitivity to temperature and humidity changes relative to polyimide films that have been used traditionally to form substrates for flexible circuits. Also, the liquid crystal polymers are relatively inexpensive. Preferred liquid crystal polymers are thermoplastic, so that they can be hot bonded or welded to metal electrically conductive elements. For precise positioning of the transducer, the flexible circuit preferably has sufficient mobility and other mechanical characteristics.

Flexible circuits provide for electrical connections between components that move relative to each other. Thus, the components can move relative to each other without interruption of the transmission of electrical signal. The flexible circuits include a dielectric substrate and one or more electrical conductors. The dielectric substrate electrically insulates the conductors from other components to prevent a short circuit and provides desired mechanical properties to the flexible circuit. The flexible circuit can optionally include a thin polymer cover to protect the electrical conductor(s).

In the improved embodiments described herein, the dielectric substrate is formed from solidified polymer liquid crystals. The polymer compositions are selected to have the desired dielectric properties. The liquid crystal polymers generally form ordered/crystalline domains without producing long range order of a crystal. The ordering within the polymer liquid crystal material can add desirable strength to the material without sacrificing needed flexibility.

The liquid crystal materials are frozen into a partial glass form such that they can form a solid substrate as a support for the flexible circuit. The underlying crystalline domains of the liquid crystal polymers are frozen into the final material. The polymers are no longer a flowable liquid in this state. The solidified liquid crystal material can have desired levels of strength, flexibility and insensitivity to environmental fluctuations. The liquid crystal polymer materials substitute for polyimide polymers in standard flexible circuits.

For use in disc drive units, a flexible circuit provides electrical connection between a transducer head and the disc drive circuity. The transducer head floats or flies above the disc surface while the disc is spinning at high speeds. The suspension arm holding the head moves such that the transducer head accesses different tracks along the disc surface. Thus, the transducer head moves in one or more dimensions relative to the fixed base of the disc drive. To obtain desirable performance characteristics of the disc drive unit, the flexible circuit should not negatively influence to motion of the transducer head. Disc drive units can be used for reading from and/or writing to a disc surface or for glide testing to identify disc imperfections.

A variety of suspension assembly designs can provide for the desired degrees of motion of the transducer head relative to the fixed disc drive base. The transducer head, or slider, is generally supported by a gimble that provides for tilting of the head relative to a load beam. The load beam is supported by a suspension arm that connects to an actuator for moving the arm to a desired position over the disc.

Suspension Assembly and Flexible Circuit

The flexible circuits generally are used in suspension assemblies that provides for the motion of a transducer or other electrical component relative to a fixed base in electrical contact with the transducer. The flexibility of the flexible circuit accommodates the relative motion of electrical elements while providing continuous electrical contact between the elements. In preferred embodiments, the flexible circuit does not significantly alter the mechanical movement of the suspension assembly or the mechanical effects of the flexible circuit are consistent over the range of operating conditions.

The suspension assembly can have any of a variety of configurations. A first embodiment of a suspension assembly is depicted in FIG. 1. A similar suspension assembly is described in U.S. Pat. No. 5,796,556 to Boutaghou, incorporated herein by reference. Suspension assembly 100 includes a load beam 102 and a flexible circuit 104. A transducer head 106 is supported near distal end 108 of lead beam 102. Post 110 is used to support flexible circuit 104 and transducer head 106. Distal end 112 of flexible circuit 104 is attached to transducer head 106. Transducer head includes transducer 114. Transducer head 106 is located near medium 116, such as a magnetic disc, such that electrical responses of transducer 114 reflect conditions on medium 116. Flexible circuit 104 is connected to external circuit 118.

Load beam 102 can be connected to an arm 120 of an actuator assembly.

Figure 2:
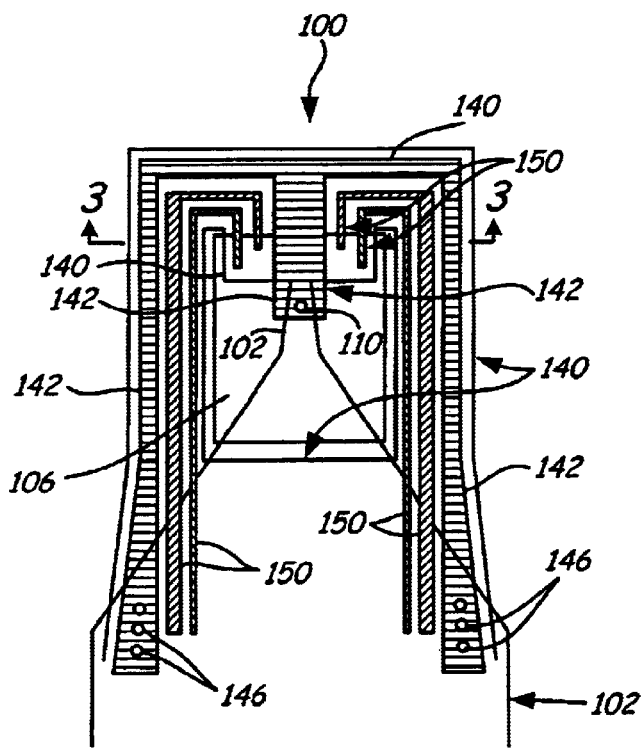
FIG. 2 is a top view of the suspension assembly of FIG. 1, where the components have been made transparent to reveal hidden structure.
Figure 3:
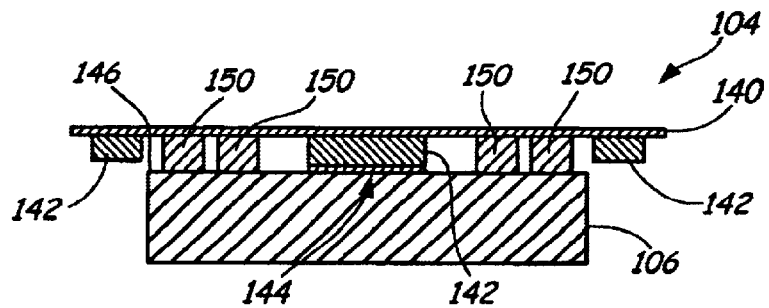
FIG. 3 is a sectional view of the suspension assembly of FIG. 2 taken along line 3—3.

The connection between flexible circuit 104 and transducer head 106 is depicted in more detail in FIGS. 2 and 3. Flexible circuit 104 includes a polymeric substrate 140 that provides flexible support for flexible circuit 104. A gimble insert 142 is attached to polymeric substrate 140. Adhesive 144 can be used to secure gimble insert 142 with transducer head 106 at top surface 146. Gimble insert 142 provides additional support for flexible circuit 104 at transducer head 106 and includes the attachment point for connecting the transducer head to the load beam.

Gimble insert 142 has a center portion and two arms that extend along the edges of flexible circuit 104 that extend beyond load beam 102. The center portion of gimble insert 142 extends beyond polymeric substrate 140 and is secured to load beam 102 at post 110. Gimble insert 142 is further welded to load beam 102 at welds 146. Gimble insert 142 is preferably made from a metal, such as iron chromium alloy (FeCr). Gimble insert 142 is somewhat flexible to provide for pitch and role of head 106.

Flexible circuit 104 further includes electrical traces 150. Electrical traces 150 are electrically conductive and provide for electrical communication between transducer 114 and external circuit 118. The number of electrical traces can vary to provide the desired electrical connections between head 106 and external circuit 118. Generally, there are a plurality of electrical traces 150.

Figure 4:
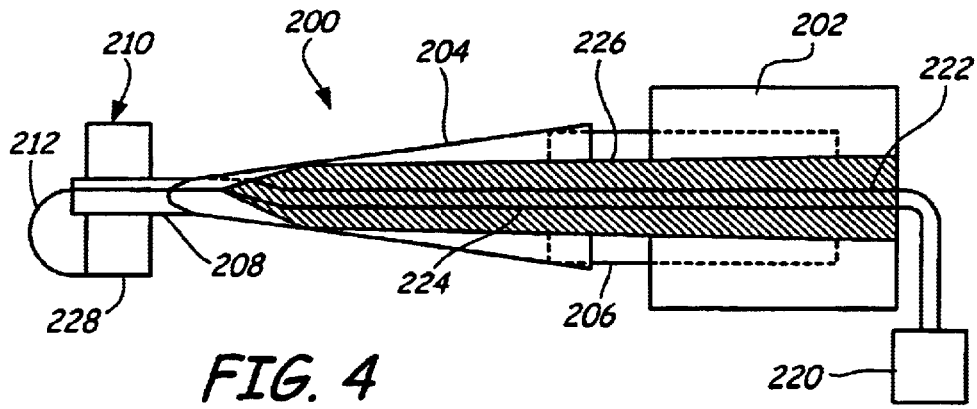
FIG. 4 is a top view of an alternative embodiment of a suspension assembly.
Figure 5:
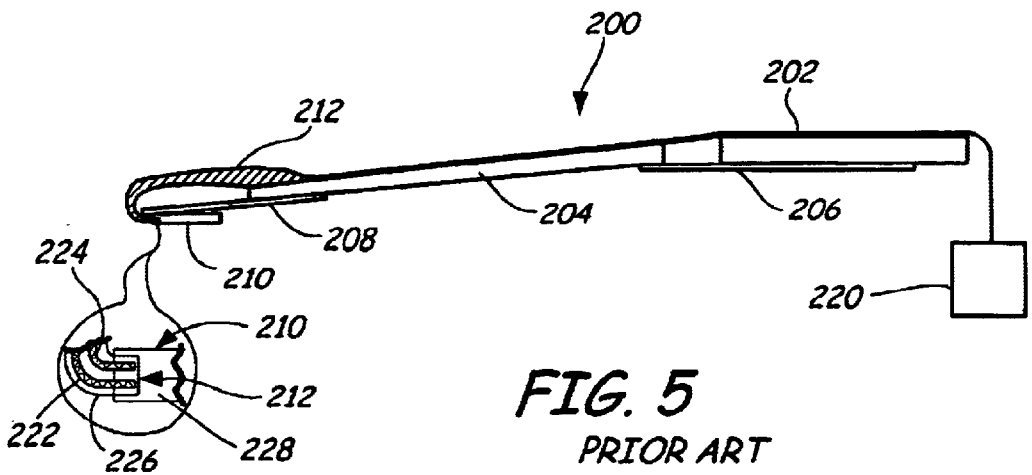
FIG. 5 is a side view of the suspension assembly of FIG. 4 where the insert displays an amplified view of the connection between a flexible circuit and a transducer head.

An alternative embodiment of a suspension assembly is depicted in FIGS. 4 and 5. A similar suspension assembly is described in U.S. Pat. No. 4,991,045 to Oberg, incorporated herein by reference. Suspension assembly 200 includes a base plate 202, a load beam 204, a spring 206, a gimble 208, transducer head 210, and flexible circuit 212. Base plate 202 is connected to an arm of an actuator, which moves suspension assembly 200 to a desired orientation. Spring 206 connects load beam 204 with base plate 202. Spring 206 can be, for example, a steel spring. Gimble 208 connects transducer head 210 to load beam 204. Gimble can be made from stainless steel and can provide for roll and pitch of transducer head 210 when the head is near a rapidly moving surface, such as a spinning disc of a disc drive.

Flexible circuit 212 provides for electrical connection between transducer head 210 and external circuit 220. Flexible circuit 232 includes electrical filaments 222, 224 that are electrically conductive. Electrical filaments 222, 224 are connected to a dielectric, polymer substrate 226. While flexible circuit 212 is depicted with two electrical filaments 222, 224, a different number of electrical filaments can be included to accommodate a desired number of distinct electrical connections between the transducer head and the external circuits.

This embodiment of flexible circuit is sometimes referred to as a pigtail due to the bend in the circuit between the transducer head and the load beam. In particular, flexible circuit 212 connects with side 228 of transducer head 210. From the transducer head, flexible circuit 212 bends to orient along load beam 204 and twists to lay flat along load beam 204.

Figure 6:
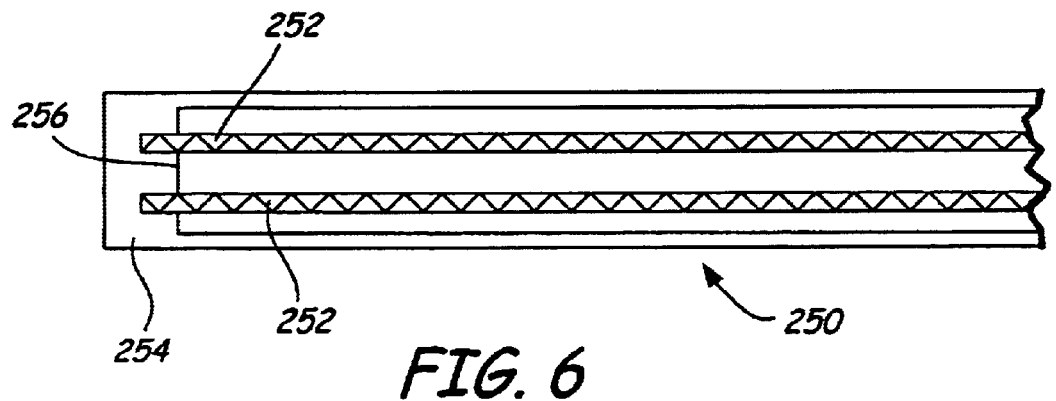
FIG. 6 is a top view of a flexible circuit where a cover layer is displayed as transparent to reveal electrical filaments between the cover and a substrate.
Figure 7:
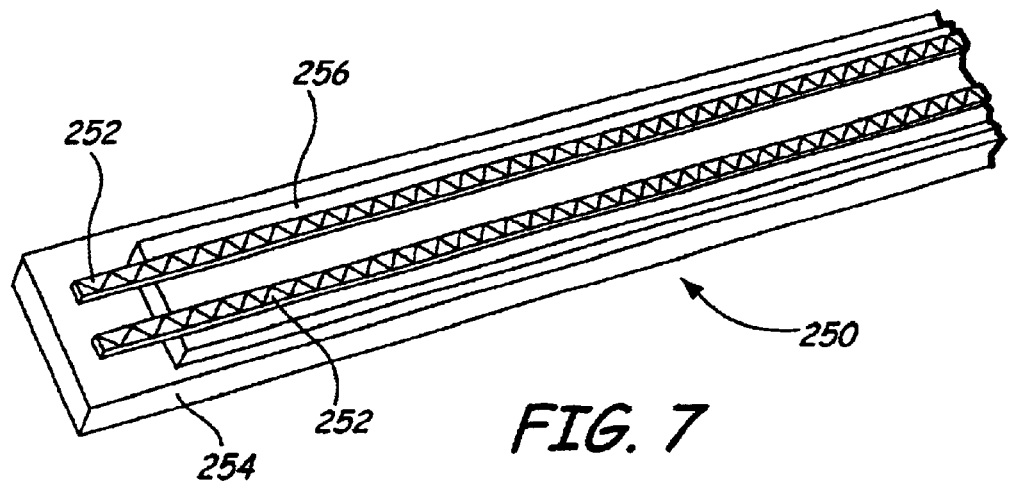
FIG. 7 is a perspective view of the suspension assembly of FIG. 6.

In general, a flexible circuit 250 includes one or more electrical filaments 252 bonded to a dielectric polymer substrate 254, as depicted in FIGS. 6 and 7. Flexible circuit 250 can optionally include a polymer cover 256. Flexible circuit 250 has a structure suitable for its intended use. For example, electrical filaments 252 are located along substrate 254 such that filaments 252 can make necessary electrical connections between a transducer head or similar mobile electrical element and an external circuit, which can be used, for example, to evaluate a signal from the transducer.

Flexible circuit 250 can include any number of electrical filaments 252, and generally includes at least two electrical filaments 252. When a plurality of electrical filaments 252 are used, the different electrical filaments 252 generally are electrically insulated from each other by dielectric substrate 254 and by air and/or ail electrically insulating cover 256. Electrical filaments 252 can be made from any electrically conducting material. Preferred materials for electrically conducting filaments include conductive metals, especially including copper.

Substrate 254 has an appropriate shape for supporting electrical filaments 252 and for attachment to elements that guide flexible filament 250 from a transducer head or the like to external circuits. For example, in the embodiment of the suspension assembly shown in FIGS. 4 and 5, the flexible circuit bends to reverse direction and twists to lay flat along a load beam. In this embodiment, the dielectric substrate generally widens for attachment to the top of the load beam so that the attachment is secure.

In the preferred embodiments, dielectric substrate 254 includes liquid crystal polymers in a partly ordered glass. Substrate 254 preferably has a thickness less than about 0.001 in and more preferably from about 0.0001 in to about 0.0005 in. In preferred embodiments, the liquid crystal polymers are ordered in planes defined by the top surface of substrate 254.

A variety of suitable liquid crystal polymers are available commercially. For example, liquid crystal polymers are available under the tradename Vectra® from Celanese Speciality Operations, Celanese Corporation, Summit, N.J. Vectra® brand polymers are primarily aromatic co-polyesters formed from p-hydroxybenzoic acid and hydroxy naphthoic acid monomers. These polymers are, available with filters, such as glass fiber fillers, graphite flakes, carbon fibers, and the like. In addition, Xydar™ brand liquid crystal polymers are available from Dartco Manufacturing Co., Augusta, Ga.:. Xydar™ polymers are polyesters based on terephthalic acid, p,p'-Dihydroxybiphenol and p-hydroxybenzoic acid, i.e., 4,4'-dihydroxydiphenyl-p-hydroxybenzoic acid terephthalic acid polymers. Versions of these polymers with fillers are also available.

Cover 256 provides protection to electrical filaments 252 from accidental contact, short circuiting and corrosion. Cover 256 can be formed from any reasonable polymer including the liquid crystal polymers used to form substrate 254. Other suitable polymers include, for example, polyimides, such as Kapton™ from DuPont, Wilmington, Del., epoxies and polyurethanes. Cover 256 preferably has a thickness less than about 0.001, and more preferably from about 0.0002 to about 0.0005.

The polymer substrate can be formed using a variety of approaches including conventional approaches. In particular, the polymer substrate can be formed by extrusion, calendering, solvent casting, melt casting, molding and the like.

Liquid crystals can be advantageously used in flexible circuits. In particular, liquid crystal films have no moisture adsorption or very little moisture adsorption. In contrast, conventional polyimide films used to form substrates of flexible circuits absorb significant amounts of moisture. Absorption of moisture can lead to dimensional instability, which can produce torque bias on a transducer head during changing temperature and humidity conditions. Also, liquid crystal polymers are relatively inexpensive. In addition, preferred liquid crystal polymers are thermoplastic, so that no adhesive is needed to secure the electrical filaments to the substrate.

Electrical filaments 252 can be attached to substrate 254 with an adhesive, such as an acrylic adhesive. Preferred liquid crystals substrates are sufficiently thermoplastic that the electrical filaments 252 can be secured to substrate 254 without all adhesive. Preferably, the filaments are treated to eliminate oxidation at the surface, for example, by applying a chemical antioxidant or by covering the surface with a corrosion resistant material such as sputtered chromium or nickel. The corrosion resistant material can be removed prior to connecting the flexible circuit to other elements to reduce electrical resistance.

In preferred embodiments, electrical filaments 252 are applied to substrate 254 by welding, hot bonding or roll lamination, at suitable temperatures and pressures for the particular materials. To increase adhesion, electrical filaments 252 can be applied to substrate at a temperature at or above its softening temperature and/or with calendering. Nevertheless, liquid crystal polymer films oriented in the plane of the film tend to have relatively poor strength along their thickness. The liquid crystal polymer preferably is selected to have desired amounts of z-axis strength.

Cover 256 can be formed as a coating directly on the substrate 254—electrical filament 252 combination. Alternatively, cover 256 can be laminated to substrate 254 using calendering or the like. Heat can be applied during the lamination process, if desired to increase the binding of cover 256. In addition, cover 256 can be coextruded with substrate 254, where the electrical filaments 252 are fed between substrate 254 and cover 256 during the extrusion process so that filaments 252 are at their proper location within the complete flexible circuit 250. Some preferred polymers for the cover can be applied as a liquid by spraying, screen printing or other approaches. The liquid is then cured, preferably using radiation, such as ultraviolet light. The radiation cure can be performed with an imaging system, such that the polymer is cured only at select locations with any uncured polymer being removed subsequent to the curing step.

The thermoplastic characteristics of the liquid crystal polymers can also be used to weld the flexible circuit to other components when assembling the flexible circuit into a suspension assembly. To perform the welding, the polymer is heated above the softening temperature for the formation of a fast, adhesiveless bond. Good adhesion can be obtained with smooth, untreated metal surfaces. The thermoplastic character also provides for the recycling of scrap material into new product.

Preferred liquid crystal polymers have a coefficient of thermal expansion similar to copper (16.5 ppm/° C.). In particular, the liquid crystal polymers preferably have a coefficient of thermal expansion from about 15 ppm/° C. to about 19 ppm/° C. Therefore, the flexible circuit has greater dimensional stability. In addition, liquid crystal polymers have a coefficient of humidity expansion close to zero, preferably less than about 4 ppm/% relative humidity and more preferably less than about 3 ppm/% relative humidity, in contrast with polyimides that have a coefficient of humidity expansion of about 8 ppm/% relative humidity. Also, liquid crystal polymers generally have a larger elastic modulus than polyimides, e.g., a representative comparison of 1100 kpsi vs. 800 kpsi, such that the substrate distorts less under stress. Preferably, the liquid crystal polymers have a elastic modulus greater than about 600 kpsi and more preferably from about 900 kpsi to about 1300 kpsi.

Also, preferred liquid crystal polymers have a reduced dielectric constant of about 2.8 relative to corresponding values for polyimides of about 3.3. Preferred liquid crystal polymers have a dielectric constant from about 2.6 to about 3.0. Having a substrate with a reduced dielectric constant leads to improved rise times and signal propagation at high data transfer rates. Furthermore, preferred liquid crystal polymers have a lower electrical dissipation factor. At 50% relative humidity, the liquid crystal polymer preferably has an electrical dissipation factor less than about 0.5% and more preferably less than about 0.3%.

Assembly of Flexible Circuits

Once the flexible circuit has been formed, the flexible circuit is integrated into the suspension assembly. To perform the integration of the components, the electrical connections of the flexible circuit are connected appropriately to complete the circuit. In addition, the flexible circuit can be secured to elements of the suspension assembly. Consistent with these two integration steps, the flexible circuit must be oriented with respect to the rest of the suspension assembly and points of attachment. The orientation and fastening of the flexible circuit preferably is performed such that the flexible circuit does not interfere significantly with the operation of the suspension assembly.

The order and approach of assembling the flexible circuit with the suspension assembly may depend on the particular construction of the various components. In some embodiments, the flexible circuit can be welded, soldered, or otherwise attached having an electrical connection with electrical contacts in the transducer head. The flexible circuit generally includes one electrical filament for each electrical contact in the transducer head. Thus, the flexible circuit provides an electrical connection with these individual electrical contacts of the transducer head and a circuit external to the suspension assembly. The electrical filaments at the end of the flexible circuit are positioned to align with the electrical contacts on the transducer head.

Generally, the flexible circuit is secured to a load beam or the like. As shown in FIGS. 1 and 2, the flexible circuit is welded at particular points to the load beam. These welds help to guide the flexible circuit as well as to prevent the flexible circuit from interfering with the operation of the suspension assembly. Similarly, in FIGS. 4 and 5 the flexible circuit is laminated to the load beam. In each of these embodiments, the flexible circuit must be shaped to conform to the intended orientation of the flexible circuit with respect to the load beam.

In the embodiment shown in FIGS. 4 and 5, the flexible circuit can be laminated to the load beam prior to attachment to the transducer head. In particular, the flexible circuit can be laminated to the load beam during the formation of the flexible circuit. In addition, the flexible circuit can be laminated or otherwise welded to other components of the suspension assembly such as an arm attached to an actuator.

The attachment of the flexible circuit allows for the motion of the suspension assembly relative to fixed external circuits. For example, a bend or other free section of flexible circuit can be located at the juncture of moveable sections of the suspension assembly relative to fixed portions of the apparatus. The other end of the flexible circuit is in electrical contact with external circuits. Generally, an electrical filament in the flexible circuit provides for electrical connection between particular contacts with the external circuit and corresponding electrical contacts in the transducer head. For example, electrical resistance in the transducer can be measured using two electrical filaments to from a single closed circuit.

Flexible Circuits for Disc Drives

In some preferred embodiments, flexible circuits are used in disc drove units. One form of disc drive unit is used to measure asperities or other imperfections on a disc surface. These disc drive units can be referred to as asperity detection units or glide testers. In these embodiments, the transducer on the transducer head is used to measure disc imperfections. In other disc drive embodiments, the transducers are used to read and/or write data to/from the disc surface. Disc drives for reading/writing data can be based on, for example, purely magnetic storage or magneto-optical data storage.

Figure 8:
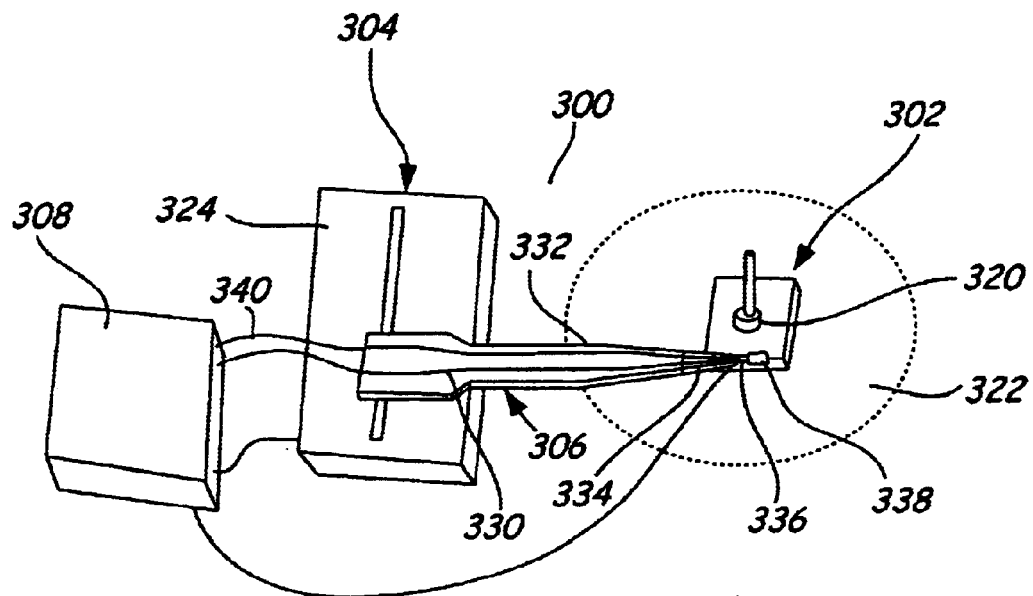
FIG. 8 is a schematic, top perspective view of a glide tester, where a disc is shown with phantom lines such that structure below the disc is visible.

Referring to FIG. 8, asperity detection unit or glide tester 300 includes a glide spinstand 302, an arm assembly drive 304, a suspension/glide head assembly 306, and a controller 308. Glide spinstand 302 includes a spindle motor 320 and disc 322, shown in phantom lines. Spindle motor 320 supports and spins disc 322. Arm assembly drive 304 has a motorized drive 324 that positions the suspension/glide head assembly 306.

Suspension/glide head assembly 306 has a support arm 330 that connects with motorized drive 324 and an arm extension 332 that extends over disc 322. Motorized drive 324 moves support arm 330 either by lateral motion or by rotational motion to alter the radial position of suspension/glide head assembly 306 along a disc 322 mounted on glide spinstand 302.

Suspension/glide head assembly 306 generally also includes suspension 334, gimbal/load beam 336 and glide head 338. Suspension 334 connects with arm extension 332. Glide head 338 is connected to suspension 334 by way of gimbal/load beam 336. Suspension 334 and gimbal/load beam 336 can have a variety of designs including conventional structures.

Controller 308 is connected to arm assembly drive 304, suspension/glide head assembly 306 and spindle motor 320. In preferred embodiments, controller 308 correlates the position of suspension/glide head assembly 306 with the rotational speed of the spindle motor to maintain an approximately constant linear speed of slider 338 relative to the disc surface. Also, controller 308 correlates impact information detected by glide head 338 with a defect location on disc 322. Glide head 338 is electrically connected to controller 308 by way of flexible circuit 340.

Figure 9:
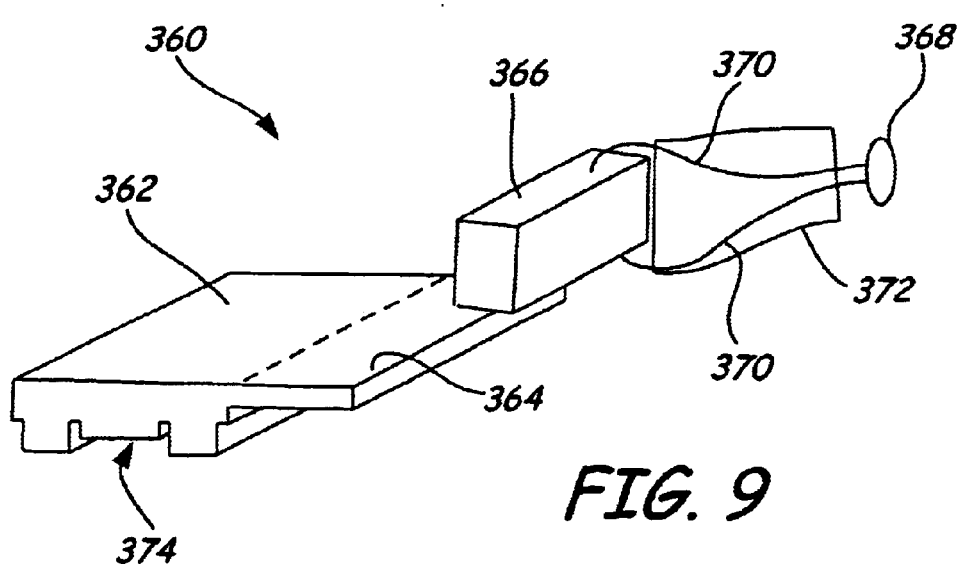
FIG. 9 is a schematic, perspective view of a glide head with a PZT transducer mounted on a wing extending from the glide head's top surface.

Glide heads generally also include a transducer. The transducer can be a piezoelectric (PZT) transducer, a conductivity transducer, a thermal transducer, or other transducers suitable for contact based asperity detection. An enlarged view of an embodiment of a glide-head 360 with a PZT transducer is shown in FIG. 9. Glide head 360 has a top surface 362 including wing 364. In the embodiment shown, PZT transducer 366 is supported by wing 364. PZT transducer 366 is connected to a measuring circuit 368 by way of electrically conductive wires 370 in flexible circuit 372. Air-bearing surface 374 is located on the opposite side of glide head 360 from top surface 362.

Figure 10:
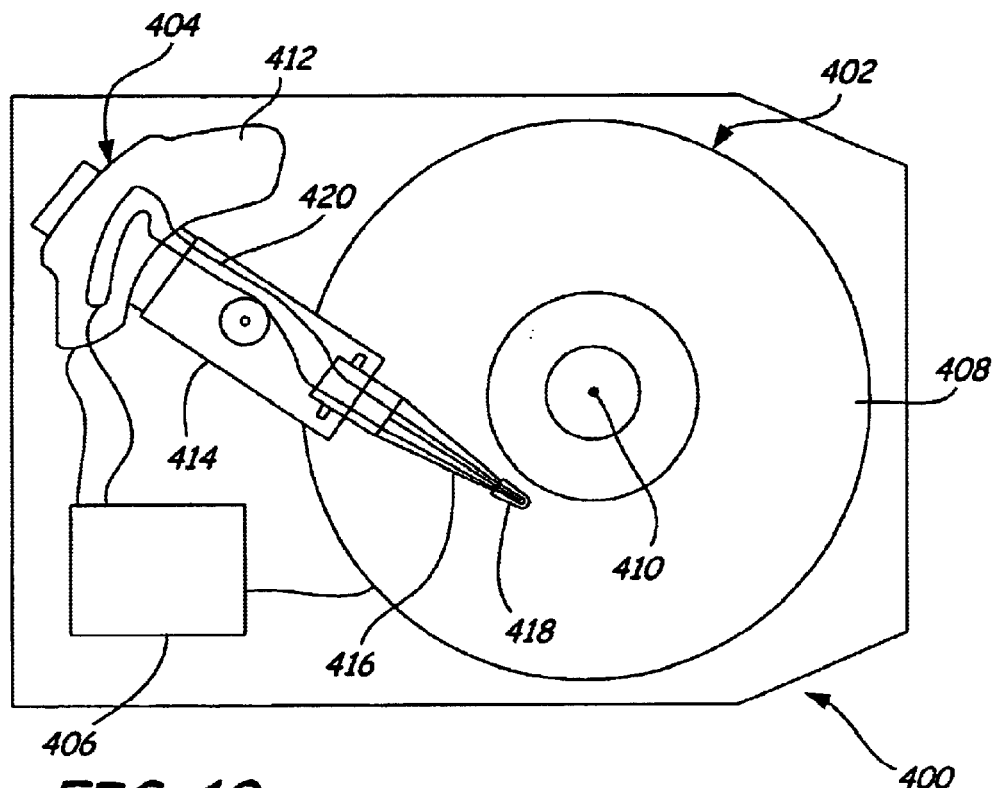
FIG. 10 is a schematic, top view of a disc drive system.

FIG. 10 depicts an embodiment of a disc drive system 400 including drive unit 402, actuator assembly 404 and controller 406. Drive unit 402 includes disc 408 and spindle 410 connected to a spindle motor. In the embodiment shown, actuator assembly 404 includes actuator 412, support arm 414, load beam 416 and gimble/head assembly 418. Actuator 412 controls the position of gimble/head assembly 418 over disc 408 by rotating or laterally moving support arm 414. Load beam 416 is located at the end of support arm 414 and gimble/head assembly 418 is located at the end of load beam 416. Controller 406 instructs actuator 412 regarding the position of support arm 414 over disc 408 and drive unit 402 regarding the control of the spindle motor. Gimble/head assembly 418 is connected to controller 406 by way of flexible circuit 420.

Figure 11:
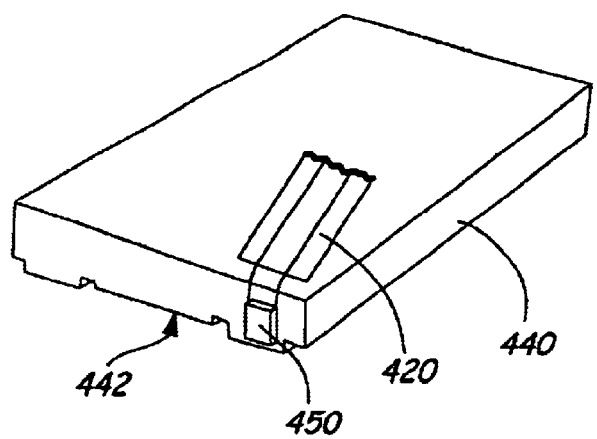
FIG. 11 is a schematic, perspective view of a slider/transducer head with a magnetic sensor.

Gimble/head assembly 418 includes a slider/head which, in operation, flies just above the disc surface. FIG. 11 depicts an embodiment of a slider 440. Slider 440 includes an air bearing surface 442 that is contoured to achieve the desired aerodynamic performance of slider 440. In this embodiment, transducer 450 is located at or near the rear edge of slider 440 although the transducer can be located at other positions on the slider. Transducer 450 includes two electrical contacts that connect with flexible circuit 420.

Although the present invention has been described with reference to preferred embodiments, workers skilled in the art will recognize that changes may be made in form and detail without departing from the spirit and scope of the invention.

What is claimed is:

1. A disc drive comprising:
   at least one data storage disc;
   a suspension assembly that includes a transducer head supported on an adjustable arm; and
   a flexible circuit comprising an electrically conductive element and a dielectric liquid crystal substrate laminated to the conductive element, the flexible circuit being electrically connected to the transducer head and the transducer head being configured to be carried proximate a surface of a spinning data storage disc.

2. The disc drive of claim 1 wherein the conductive element comprises copper.

3. The disc drive of claim 1 wherein the dielectric liquid crystal substrate has a thickness less than about 0.001 inches.

4. The disc drive of claim 1 wherein the dielectric liquid crystal substrate has a thickness from about 0.0001 inches to about 0.0005 inches.

5. The disc drive of claim 1 wherein the dielectric liquid crystal substrate comprises a polyester.

6. The disc drive of claim 1 wherein the dielectric liquid crystal substrate has a dielectric constant from about 2.6 to about 3.0.

7. The disc drive of claim 1 wherein the dielectric liquid crystal substrate has a coefficient of thermal expansion from about 15 ppm/° C. to about 19 ppm/° C.

8. The disc drive of claim 1 wherein the dielectric liquid crystal substrate has a coefficient of humidity expansion of less than about 4 ppm/% relative humidity.

9. The disc drive of claim 1 wherein the dielectric liquid crystal substrate has an elastic modulus from about 900 kpsi to about 1300 kpsi.

10. The disc drive of claim 1 further comprising a cover coating forming protective coating over at least a portion of the conductive element.

11. The disc drive of claim 1 wherein the liquid crystal substrate comprises a thermoplastic.

12. The disc drive of claim 1 wherein the data storage disc comprises a magnetic disc.

* * * * *